(12) United States Patent  
Kususaki

(10) Patent No.: US 9,560,299 B2  
(45) Date of Patent: Jan. 31, 2017

(54) IMAGE PICKUP APPARATUS

(71) Applicant: CANON KABUSHIKI KAISHA, Tokyo (JP)

(72) Inventor: Tomoki Kususaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/887,003

(22) Filed: Oct. 19, 2015

(65) Prior Publication Data

US 2016/0119566 A1    Apr. 28, 2016

(30) Foreign Application Priority Data

Oct. 23, 2014 (JP) ................................. 2014-216615

(51) Int. Cl.
*H04N 5/374*    (2011.01)
*H01L 27/146*    (2006.01)
*H04N 5/3745*    (2011.01)

(52) U.S. Cl.
CPC .... *H04N 5/37452* (2013.01); *H01L 27/14609* (2013.01)

(58) Field of Classification Search
CPC  H04N 5/37452; H04N 5/3559; H04N 5/3745; H01L 27/14614; H01L 27/14609
See application file for complete search history.

(56) References Cited

U.S. PATENT DOCUMENTS

| | | | | |
|---|---|---|---|---|
| 9,118,883 B2* | 8/2015 | Wan | ................ | H04N 5/765 |
| 2008/0252742 A1* | 10/2008 | Oike | ................ | H04N 5/3741 348/222.1 |
| 2009/0045319 A1* | 2/2009 | Sugawa | ............. | H04N 5/35572 250/208.1 |
| 2010/0201797 A1* | 8/2010 | Shizukuishi | ....... | H04N 5/37452 348/68 |
| 2011/0134298 A1* | 6/2011 | Aoyama | ............ | H04N 5/37452 348/311 |
| 2011/0242378 A1* | 10/2011 | Mabuchi | ............ | H04N 5/35581 348/296 |
| 2013/0044247 A1* | 2/2013 | Kawahito | .......... | H04N 5/35581 348/296 |
| 2013/0222681 A1* | 8/2013 | Wan | ...................... | H04N 5/272 348/371 |
| 2015/0085170 A1* | 3/2015 | Takeda | ................ | H04N 5/3559 348/296 |

FOREIGN PATENT DOCUMENTS

JP    2009-296574 A    12/2009

* cited by examiner

*Primary Examiner* — Jason Flohre
(74) *Attorney, Agent, or Firm* — Canon USA, Inc. I.P. Division

(57) ABSTRACT

At least one image pickup apparatus includes a plurality of pixels each including a photoelectric conversion unit, a charge storage unit, and an amplification unit. The charge storage unit includes a first charge storage unit, a second charge storage unit, and a third charge storage unit. In a first period from a first time to a second time, charges generated by the photoelectric conversion unit in the first period are transferred to the first charge storage unit and charges stored in the second charge storage unit and the third charge storage unit in a period preceding the first period are transferred to an input node of the amplification unit. In a second period from the second time to a third time, charges generated by the photoelectric conversion unit in the second period are transferred to the first charge storage unit and the third charge storage unit for storage.

14 Claims, 10 Drawing Sheets

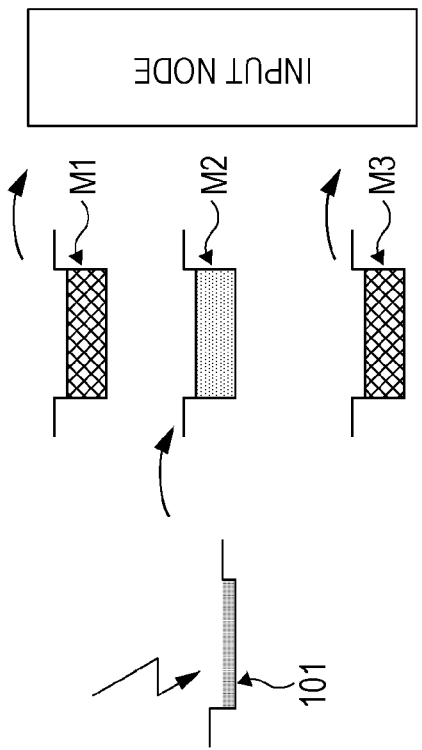
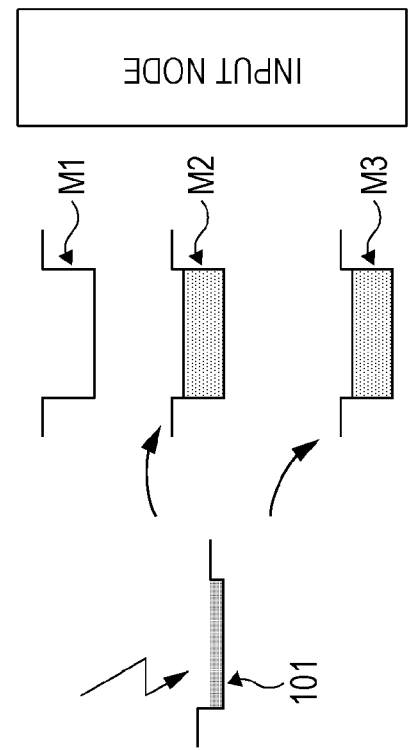
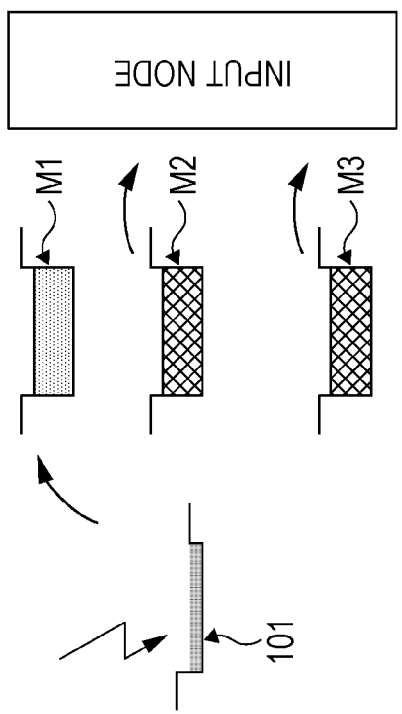
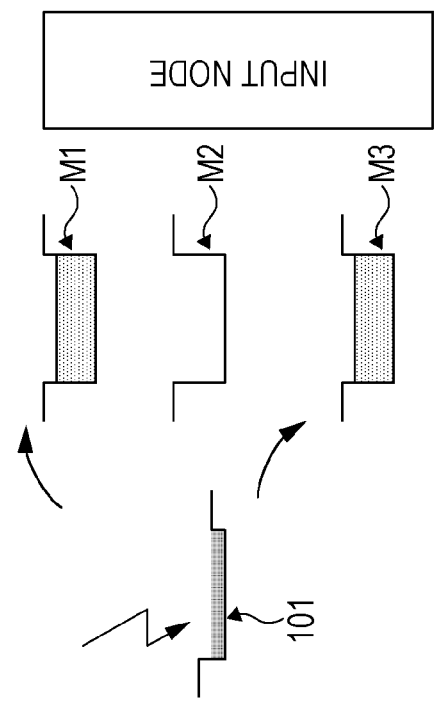

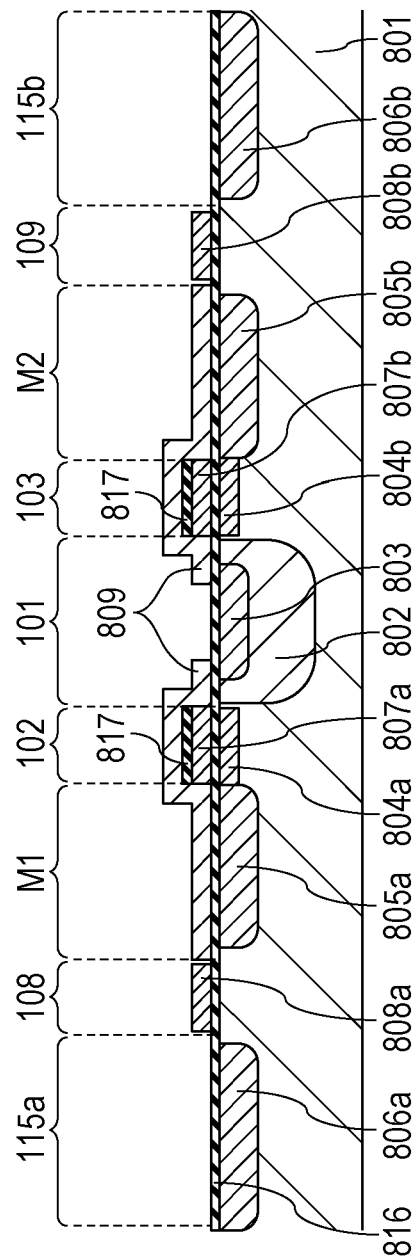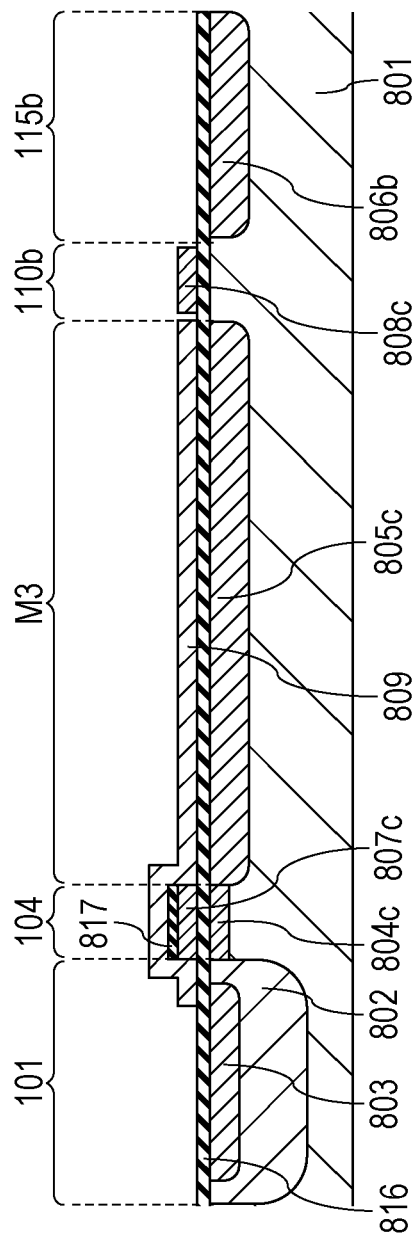

IMAGE PICKUP APPARATUS

BACKGROUND OF THE INVENTION

Field of the Invention

The present disclosure relates to image pickup apparatuses, and, more particularly, to an image pickup apparatus including a plurality of charge storage units for storing charges generated by a photoelectric conversion unit.

Description of the Related Art

Image pickup apparatuses each including a charge storage unit capable of performing a global electronic shutter operation are known.

Japanese Patent Laid-Open No. 2009-296574 discloses an image pickup apparatus that includes pixels each including two charge storage units for storing charges generated by a single photoelectric conversion unit. These charge storage units are used for different frames.

SUMMARY OF THE INVENTION

The present disclosure provides at least one image pickup apparatus including a plurality of pixels each including a photoelectric conversion unit, a charge storage unit configured to store charges generated by the photoelectric conversion unit, and an amplification unit configured to output a signal based on charges stored by the charge storage unit. The charge storage unit includes a first charge storage unit, a second charge storage unit, and a third charge storage unit. In a first period from a first time to a second time, charges generated by the photoelectric conversion unit in each of the plurality of pixels in the first period are transferred to the first charge storage unit and charges stored in the second charge storage unit and the third charge storage unit in a period preceding the first period are transferred to an input node of the amplification unit. In a second period from the second time to a third time, charges generated by the photoelectric conversion unit in each of the plurality of pixels in the second period are transferred to the first charge storage unit and the third charge storage unit for storage.

According to other aspects of the present disclosure, one or more additional image pickup apparatuses and one or more driving methods are discussed herein. Further features of the present disclosure will become apparent from the following description of exemplary embodiments with reference to the attached drawings.

BRIEF DESCRIPTION OF THE DRAWINGS

FIGS. 2A to 2D are schematic diagrams describing the movement of charges in each pixel.

FIGS. 6A and 6B are schematic cross-sectional views of a pixel.

DESCRIPTION OF THE EMBODIMENTS

An image pickup apparatus according to an embodiment of the present disclosure will be described with reference to FIG. 1 and FIGS. 2A to 2D. An image pickup apparatus according to this embodiment includes pixels each including three or more charge storage units for storing charges generated by a single photoelectric conversion unit.

Figure 1:
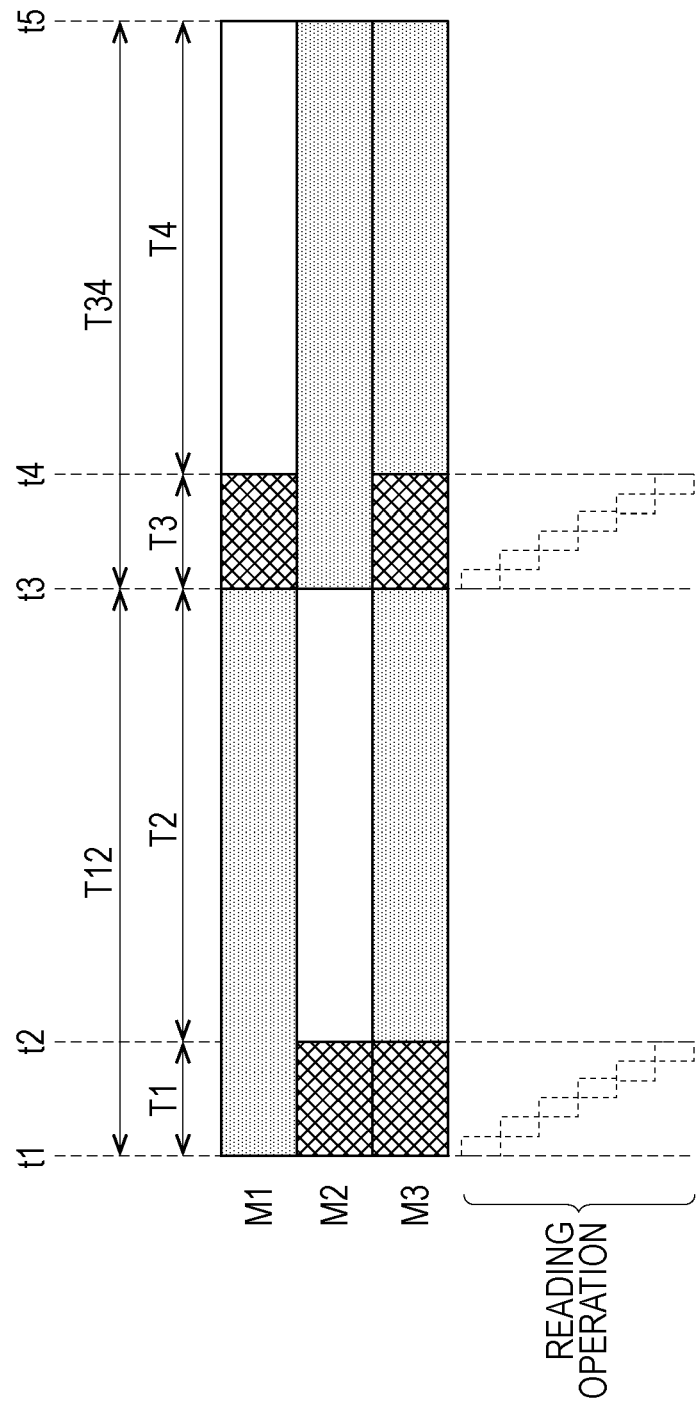
FIG. 1 is a schematic diagram describing the storage of charges and the order of transfer.

FIG. 1 is a diagram illustrating a sequence of reading a signal from a pixel in two continuous frames. FIGS. 2A to 2D are schematic diagrams describing the movement of charges from a photoelectric conversion unit to each charge storage unit.

Referring to FIG. 1, charges generated by a photoelectric conversion unit in a first exposure period T12 are used for the formation of an image of an nth frame, and charges generated by the photoelectric conversion unit in a second exposure period T34 are used for the formation of an image of an (n+1)th frame. By capturing the images of a plurality of frames including a frame preceding these frames and a frame subsequent to these frames, the capturing of a moving image can be performed. Charges generated by the photoelectric conversion unit are stored in one of a first charge storage unit M1, a second charge storage unit M2, and third charge storage unit M3 and are then transferred to the input node of an amplification unit.

FIG. 2A illustrates the movement of charges among the photoelectric conversion unit, the charge storage units, and the input node of the amplification unit in a first period T1 in FIG. 1. FIGS. 2B, 2C, and 2D illustrate the movement of charges among the photoelectric conversion unit, the charge storage units, and the input node of the amplification unit in a second period T2, a third period T3 and a fourth period T4, respectively, illustrated in FIG. 1.

In the first period T1 that is a period from a first time t1 to a second time t2, charges that are stored in the second charge storage unit M2 and the third charge storage unit M3 and are to be used for the formation of an image of a preceding frame (an (n−1)th frame) are transferred to the input node of the amplification unit in units of rows. A portion represented by "reading operation" in FIG. 1 is a period in which charges stored in the second charge storage unit M2 and the third charge storage unit M3 are transferred to the input node of the amplification unit in units of rows and then signals are read out to signal lines.

In parallel with this reading operation, charges generated by the photoelectric conversion unit in the first period T1 are transferred to the first charge storage unit M1 for storage. When the amount of incident light exceeds a predetermined value, charges are stored in both the first charge storage unit M1 and the photoelectric conversion unit.

The second period T2 is a period from the second time t2 to a third time t3. At the second time t2, the transfer of stored charges from the second charge storage unit M2 and the third charge storage unit M3 to the input node of the amplification unit is completed in all rows. Charges generated in the second period T2 are transferred to at least the third charge storage unit M3 for storage. That is, the third charge storage unit M3 is used for the storage of charges to be used for the formation of images of the (n−1)th frame and the nth frame.

Charges that are generated by the photoelectric conversion unit in the second period T2 and are to be used for the formation of an image of the nth frame are stored in at least the third charge storage unit M3. However, when the amount of incident light exceeds a predetermined value, charges are also stored in the photoelectric conversion unit. The charges generated by the photoelectric conversion unit in the second period T2 may also be transferred to the first charge storage unit M1 in addition to the third charge storage unit M3 and be stored in these units.

In all rows, charges generated in the first period T1 are stored in the first charge storage unit M1 and charges generated in the second period T2 are stored in at least the third charge storage unit M3. As a result, in all rows, the same exposure period can be set.

In a third period T3 that is a period from the third time t3 to a fourth time t4, charges that have been generated in a first exposure period T12 and have been stored in the first charge storage unit M1 and the third charge storage unit M3 are transferred to the input node of the amplification unit in units of rows.

A portion represented by "reading operation" in FIG. 1 is a period in which charges stored in the first charge storage unit M1 and the third charge storage unit M3 are transferred to the input node of the amplification unit in units of rows and then signals are read out to signal lines.

In parallel with this reading operation, charges generated in the third period T3 are transferred to the second charge storage unit M2 for storage. When the amount of incident light exceeds a predetermined value, charges are stored in both the second charge storage unit M2 and the photoelectric conversion unit. As a result, the charges generated in the third period T3 are not lost.

A fourth period T4 is a period from the fourth time t4 to a fifth time t5. At the time t4, the transfer of charges stored in the first charge storage unit M1 and the third charge storage unit M3 to the input node of the amplification unit is completed in all rows. Charges generated in the fourth period T4 are transferred to at least the third charge storage unit M3 for storage. That is, the third charge storage unit M3 is used for the storage of charges to be used for the formation of images of the nth frame and the (n+1)th frame.

Charges that are generated by the photoelectric conversion unit in the fourth period T4 and are to be used for the formation of an image of the (n+1)th frame are stored in at least the third charge storage unit M3. However, when the amount of incident light exceeds a predetermined value, charges are also stored in the photoelectric conversion unit. The charges generated by the photoelectric conversion unit in the fourth period T4 may also be transferred to the second charge storage unit M2 in addition to the third charge storage unit M3 and be stored in these units.

According to the above-described operations, each of the first charge storage unit M1 and the second charge storage unit M2 may have a capacitance value with which the charge storage unit can store, along with the photoelectric conversion unit, charges generated in a period of transfer of charges to the input node of the amplification unit. Accordingly, as compares with a case where two charge storage units are exclusively used for different frames as disclosed in Japanese Patent Laid-Open No. 2009-296574, the capacitance values of the first charge storage unit M1 and the second charge storage unit M2 can be reduced.

In all rows, charges generated in the third period T3 are stored in the second charge storage unit M2 and charges generated in the fourth period T4 are generated in at least the third charge storage unit M3. As a result, the same exposure period can be set in all rows.

By repeatedly performing these operations for a plurality of frames, a moving image can be captured.

It is assumed that two charge storage units (the first charge storage unit M1 and the second charge storage unit M2) are exclusively used for different frames at the time of moving image capturing. In this case, while charges to be used for the formation of an image of the (n−1)th frame are stored in the first charge storage unit M1 and the charges are read out from the first charge storage unit M1, charges to be used for the formation of an image of the nth frame are stored in the second charge storage unit M2. After the reading of charges from the first charge storage unit M1 has been completed in all rows, the first charge storage unit M1 needs to store charges to be used for the formation of an image of the (n+1)th frame.

In order to perform image capturing without a break, it is necessary to shorten a time taken to switch between the reading of charges from the first charge storage unit M1 and the storage of charges in the first charge storage unit M1. However, if the time is too short, charges may partially remain in the first charge storage unit M1 without being transferred to the input node of an amplification unit. These remaining charges may affect the formation of an image.

According to a driving method according to an embodiment of the present disclosure, after the reading of charges from the first charge storage unit M1 and the second charge storage unit M2 has been completed, there is a predetermined period before the next storage of charges. The above-described influence of remaining charges can be therefore reduced. Even if charges remain in a charge storage unit, the amount of remaining charges can be reduced by resetting the charge storage unit after the reading of charges from the charge storage unit.

Embodiments of the present disclosure will be described in detail below.

First Embodiment

An image pickup apparatus according to this embodiment will be described with reference to FIGS. 3 to 7. Referring to these drawings, the same reference numerals are used to identify parts already described with reference to FIG. 1 and FIGS. 2A to 2D, and the description thereof will be therefore omitted.

Figure 3:
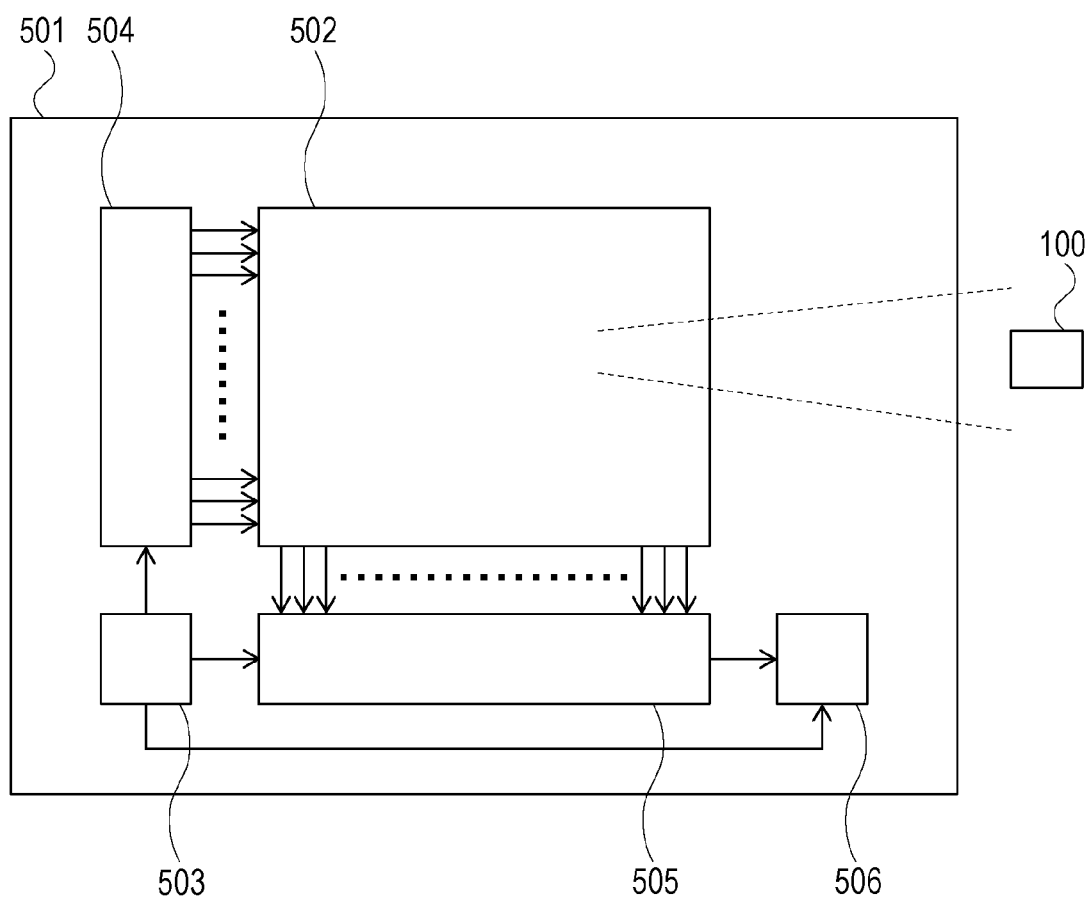
FIG. 3 is a block diagram of an image pickup apparatus.

FIG. 3 is a block diagram of an image pickup apparatus according to this embodiment. An image pickup apparatus 501 includes a pixel unit 502, a driving pulse generation unit 503, a vertical scanning circuit 504, a signal processing circuit 505, and an output unit 506.

The pixel unit 502 includes a plurality of pixels 100 for converting light into an electric signal and outputting the converted electric signal. The pixels 100 are arranged in a matrix. The driving pulse generation unit 503 generates a driving pulse. Upon receiving a driving pulse from the driving pulse generation unit 503, the vertical scanning circuit 504 supplies a control pulse to each pixel. The signal processing circuit 505 sequentially transmits signals that are output from a plurality of pixel columns in parallel to the output unit 506. The signal processing circuit 505 may further include a column circuit for amplifying a signal and performing analog-to-digital conversion which corresponds to each pixel column.

Next, the equivalent circuit of a pixel according to this embodiment will be described with reference to FIG. 4.

A photoelectric conversion unit 101 generates charges in accordance with the amount of incident light by performing photoelectric conversion. As an example of the photoelectric conversion unit 101, a photodiode is illustrated.

First transfer units 102, 103, and 104 transfer charges generated by the photoelectric conversion unit 101 to the charge storage units M1, M2, and M3, respectively. For discrimination, the first transfer units 102, 103, and 104 are referred to as a first first-transfer unit, a second first-transfer unit, and a third first-transfer unit, respectively as appropriate. Control pulses pTx1, pTx2, and pTx3 are supplied to the gates of the first transfer units 102, 103, and 104, respectively so as to switch between an ON state (conduction) and an OFF state (non-conduction).

Second transfer units 108, 109, and 110 (110a, 110b) transfer charges stored in the first charge storage unit M1, the second charge storage unit M2, and the third charge storage unit M3 to an input node 112 of an amplification transistor (amplification unit) 111, respectively. For discrimination, the second transfer units 108, 109, and 110 are referred to as a first second-transfer unit, a second second-transfer unit, and a third second-transfer unit, respectively as appropriate. Control pulses pTx4, pTx5, and pTx6 are supplied to the gates of the second transfer units 108, 109, and 110, respectively so as to switch between an ON state and an OFF state.

As the first transfer units 102, 103, and 104 and the second transfer units 108, 109, and 110, transfer transistors are used. However, transfer transistors do not necessarily have to be used, and any components capable of switching between an ON state and OFF state, for example, switches, can be used.

The amplification transistor 111 amplifies a signal based on the charges that have been transferred from the second transfer units 108, 109, and 110 to the input node 112 thereof and outputs an amplified signal. More specifically, the charges that have been transferred to the input node 112 are converted into a voltage in accordance with the amount of the charges and a signal based on the voltage is output from a pixel via the amplification transistor 111. As an example of the amplification unit, a source follower circuit using a MOS transistor is illustrated. The input node 112 is configured to store charges. In the following description, the amplification transistor 111 is used as the amplification unit.

A reset transistor 113 supplies a reference potential to the input node 112 of the amplification transistor 111. By overlapping the ON period of the reset transistor 113 and the ON period of each of the second transfer units 108, 109, and 110 with each other, the potential of each of the first charge storage unit M1, the second charge storage unit M2, and the third charge storage unit M3 can be reset. Furthermore, by overlapping the ON period of the reset transistor 113 and the ON period of each of the first transfer units 102, 103, and 104 with each other, the photoelectric conversion unit 101 can be reset. A control pulse pRES is supplied to the gate of the reset transistor 113 so as to switch between an ON state and an OFF state.

Using selection transistors 114, signals are output from a plurality of pixels connected to a single signal line 621 one by one or some of them at a time. The drain of the amplification transistor 111 is connected to a power supply line 620 to which a power supply voltage is supplied. The source of the amplification transistor 111 is connected to the drain of the selection transistor 114. The source of the selection transistor 114 is connected to the signal line 621.

A pixel may further include an overflow drain unit (OFD unit) for outputting excess charges generated by the photoelectric conversion unit 101.

In another configuration other than the above-described configuration, the selection transistor 114 may be disposed between the drain of the amplification transistor 111 and the power supply line 620. In both of these configurations, the selection transistor 114 controls the electric connection between the amplification transistor 111 and the signal line 621. A control pulse pSEL is supplied to the gate of the selection transistor 114 so as to switch between the ON state and the OFF state of the selection transistor 114.

The selection transistor 114 does not necessarily have to be disposed. In this case, the switching between the ON state and the OFF state with respect to the signal line 621 may be performed by switching the potential of the drain or gate of the amplification transistor 111.

The signal line 621 transmits a signal output from the amplification transistor 111 to a column circuit (not illustrated).

Figure 5:
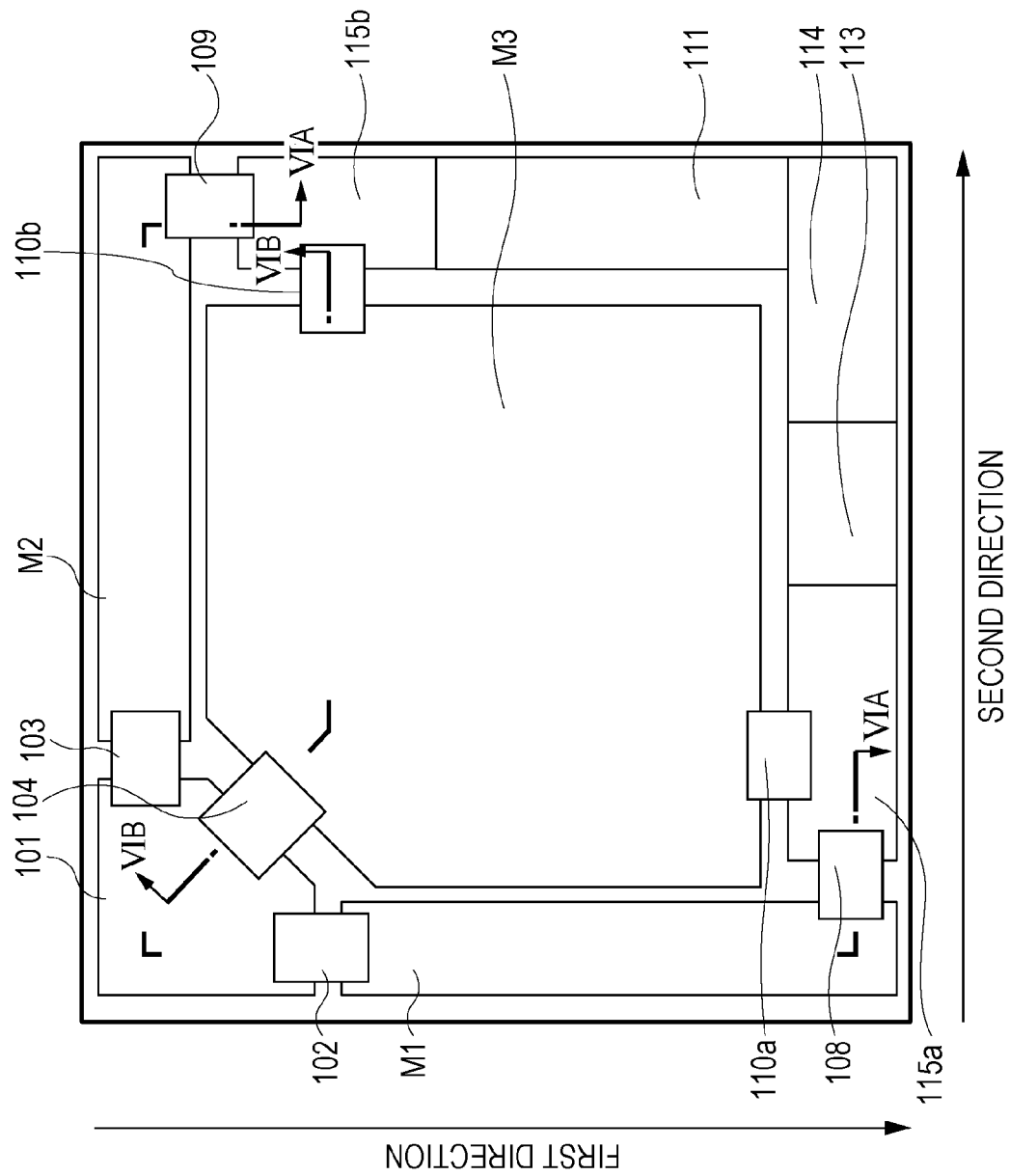
FIG. 5 is a schematic plan view of a pixel.

FIG. 5 is a schematic plan view of a single pixel according to this embodiment. This drawing illustrates the pixel 100 when viewed in plan and illustrates the exemplary arrangement of components according to this embodiment. Each component is rectangular in shape for simplification of the drawing, but does not actually have a rectangular shape. Each rectangular region indicates that a corresponding component is disposed in the region. In the drawing, only one pixel is illustrated. However, an image pickup apparatus according to an embodiment of the present disclosure includes a pixel region where a plurality of such pixels is arranged.

Referring to FIG. 5, the first charge storage unit M1 is disposed in a first direction (a downward direction in the drawing) with respect to the photoelectric conversion unit 101. The second charge storage unit M2 is disposed in a second direction (a rightward direction), which is orthogonal to the first direction, with respect to the photoelectric conversion unit 101. The third charge storage unit M3 is disposed in a direction different from the first direction and the second direction with respect to the photoelectric conversion unit 101.

In the pixel, floating diffusion regions 115a and 115b that form the input node 112 of the amplification unit are provided. Charges from the first charge storage unit M1 and the third charge storage unit M3 are transferred to the floating diffusion region 115a. Charges from the second charge storage unit M2 and the third charge storage unit M3 are transferred to the floating diffusion region 115b.

The amplification transistor 111, the reset transistor 113, and the selection transistor 114 are disposed so that they are adjacent to one another. With this arrangement, it is possible to dispose these three transistors in the same active region. This leads to the miniaturization of a pixel. An element isolation region may be provided between the photoelectric conversion unit and each transistor or between each charge storage unit and a corresponding transistor.

FIGS. 6A and 6B are schematic cross-sectional views of a single pixel according to this embodiment. FIG. 6A is a schematic cross-sectional view of a pixel taken along the line VIA-VIA of FIG. 5, and FIG. 6B is a schematic cross-sectional view of a pixel taken along the line VIB-VIB of FIG. 5.

Descriptions will be made under the assumption that a first conductivity type is P-type, a second conductivity type is N-type opposite to the first conductivity type, signal charges are electrons, and each transistor is an N-type transistor. Alternatively, holes may be used as signal charges and P-type transistors may be used.

The photoelectric conversion unit 101 includes a photodiode including a P-type semiconductor region (a first semiconductor region) 801 and an N-type semiconductor region 802. By providing a P-type semiconductor region 803 on the surface of the N-type semiconductor region 802, a pinned photodiode is achieved.

N-type semiconductor regions (second semiconductor regions) 805a, 805b, and 805c form parts of the first charge storage unit M1, the second charge storage unit M2, and the third charge storage unit M3, respectively, and store charges transferred from the photoelectric conversion unit 101. The N-type semiconductor regions 805a, 805b, and 805c have the same impurity concentration and the same depth, and can be formed in the same process.

The impurity concentration of the N-type semiconductor region 802 may differ from that of the N-type semiconductor regions 805a, 805b, and 805c. For example, by reducing the impurity concentration of the N-type semiconductor region 802, the efficiency of transfer of charges from the N-type semiconductor region 802 to the N-type semiconductor regions 805a, 805b, and 805c is improved.

An N-type semiconductor region 806a forms the floating diffusion region 115a. An N-type semiconductor region 806b forms the floating diffusion region 115b. The floating diffusion regions 115a and 115b are electrically connected to each other via the gate of the amplification transistor 111 and a plug.

N-type semiconductor regions 804a, 804b, and 804c are provided at channels between the N-type semiconductor regions 805a, 805b, and 805c and the N-type semiconductor region 802, respectively. Referring to FIGS. 6A and 6B, pinned channels are formed by doping low-density N-type impurity.

First control electrodes 807a, 807b, and 807c are disposed on the N-type semiconductor regions 804a, 804b, and 804c via an insulating film 816 to form the first transfer units 102, 103, and 104, respectively. Second control electrodes 808a, 808b, and 808c form the second transfer units 108, 109, and 110, respectively. A light-shielding film 809 is provided on the first control electrodes 807a, 807b, and 807c via an insulating film 817 and is provided over the N-type semiconductor regions 805a, 805b, and 805c.

The light-shielding film 809 prevents light from entering the N-type semiconductor regions 805a, 805b, and 805c. The generation of charges can be therefore suppressed. On the surfaces of the N-type semiconductor regions 805a, 805b, and 805c, P-type semiconductor regions (not illustrated) may be provided. With this configuration, the occurrence of a dark current can be suppressed.

Figure 4:
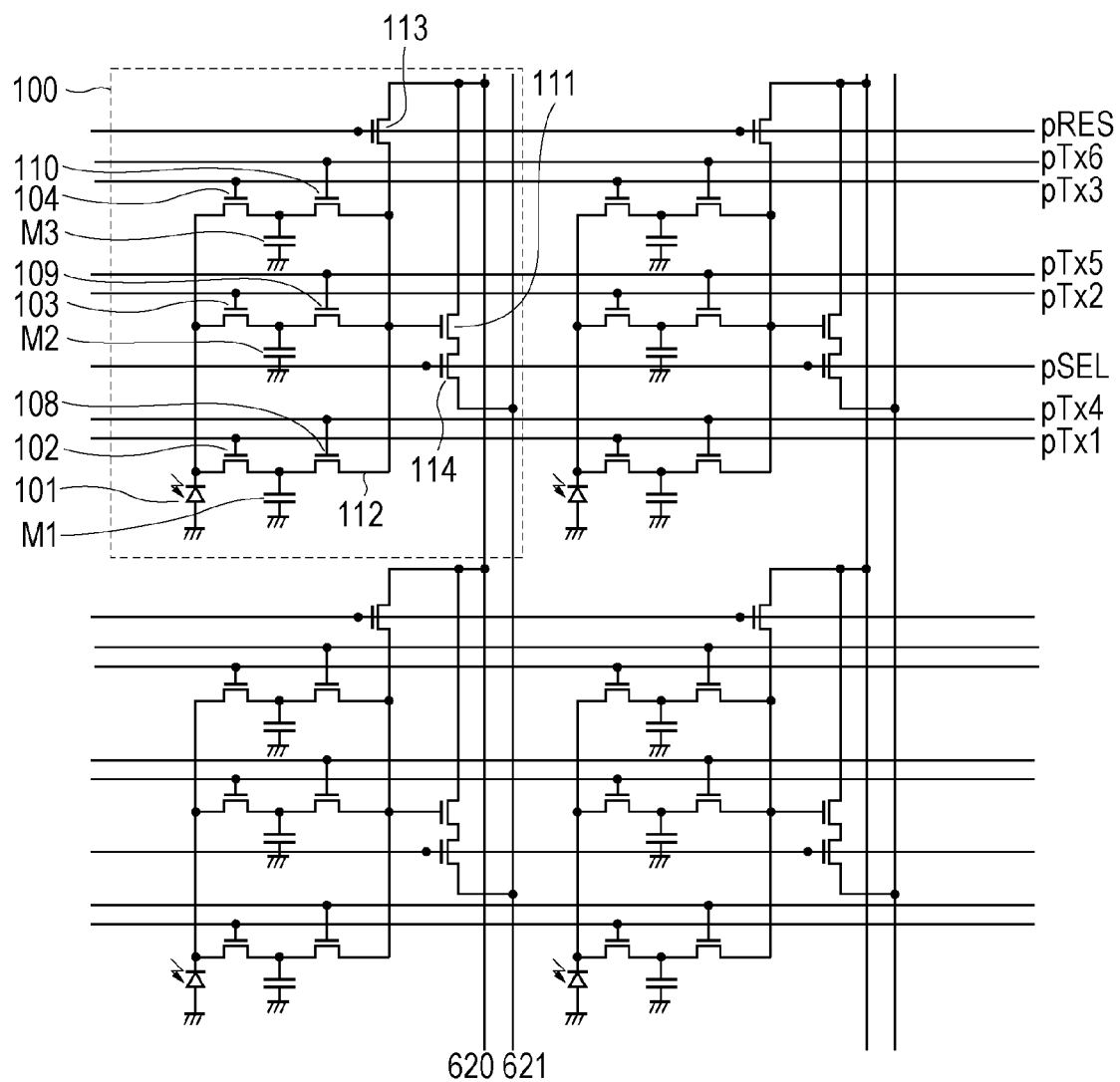
FIG. 4 is an equivalent circuit diagram of a pixel.
Figure 7:
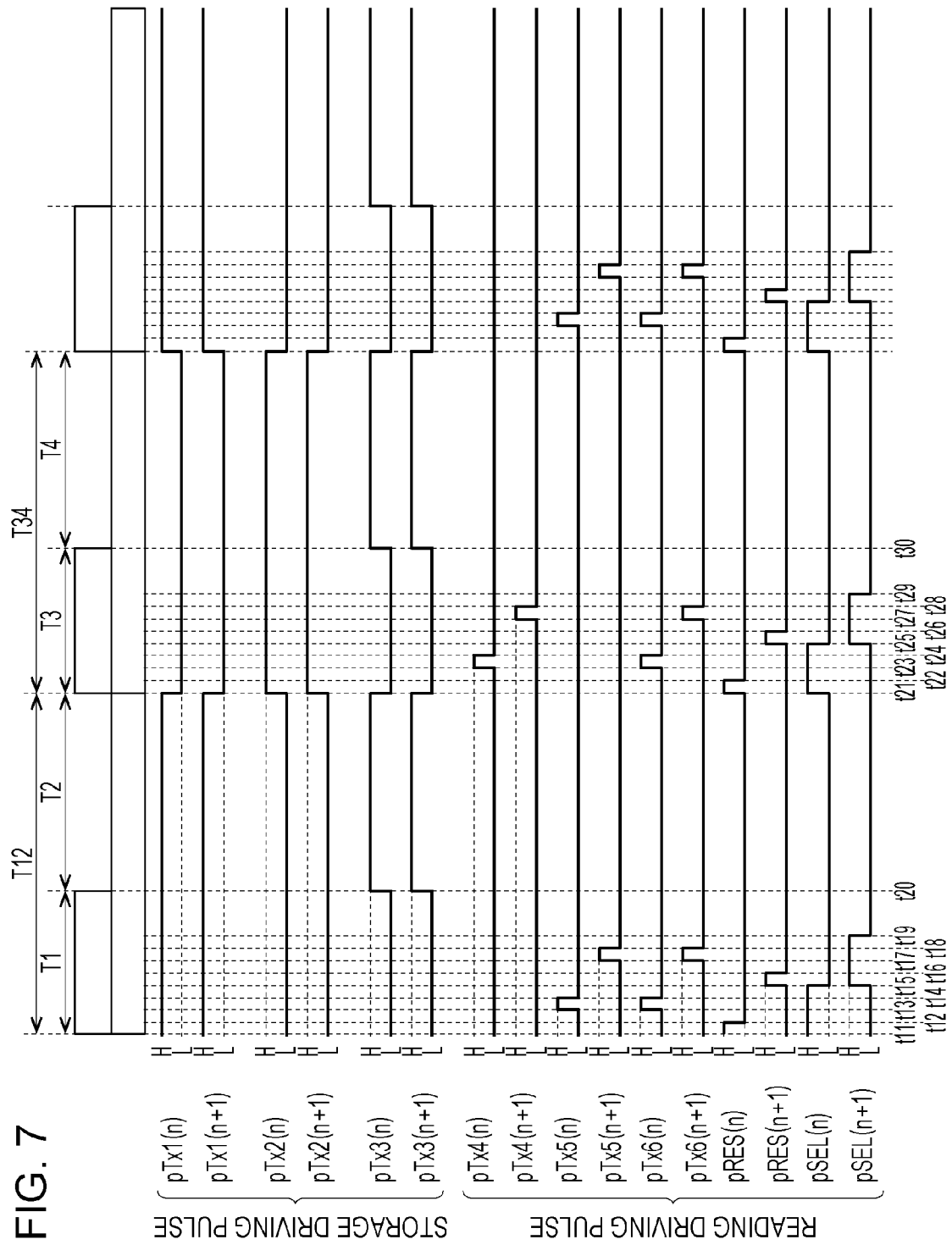
FIG. 7 is a driving timing chart.

FIG. 7 is a diagram illustrating examples of driving pulses for the image pickup apparatus 501 illustrated in FIG. 4. FIG. 7 illustrates driving pulses for pixels in an nth row (n) and driving pulses for pixels in an (n+1)th row (n+1).

In the drawing, driving pulses for two rows are illustrated. In a case where a plurality of rows are further added, signals can be read out from all pixel rows by applying the same storage driving pulse to all pixel rows and sequentially applying reading driving pulses to the pixel rows at different times.

Referring to FIG. 7, the period from a time t11 to a time t30 is illustrated. An operation in the period from the time t21 to the time t30 is similar to that in the period from the time t11 to the time t20, and the repeated description thereof will be therefore omitted as appropriate.

Input driving pulses are represented by solid lines in FIG. 7. When a driving pulse is at a high level (H), a corresponding transistor or a corresponding switch is in the ON state. When a driving pulse is at a low level (L), a corresponding transistor or a corresponding switch is in the OFF state. Upon receiving a control pulse generated by the driving pulse generation unit 503 in an image pickup apparatus, the vertical scanning circuit 504 supplies these driving pulses to corresponding pixels.

The first time t1 in FIG. 1 corresponds to the time t11 in FIG. 7. The second time t2 in FIG. 1 corresponds to the time t20 in FIG. 7. The third time t3 in FIG. 1 corresponds to the time t21 in FIG. 7. The fourth time t4 in FIG. 1 corresponds to the time t30 in FIG. 7.

At the time t11 from which the first exposure period T12 is started, in all rows, pTx1 is at the H level and pTx2 and pTx3 are at the L level. Accordingly, the first first-transfer unit 102 is in the ON state and the second first-transfer unit 103 and the third first-transfer unit 104 are in the OFF state. Since pRes for the nth row is at the H level, each reset transistor in the nth row is in the ON state and the potential of the input node 112 is reset. At that time, charges generated by the photoelectric conversion unit are transferred not to the second charge storage unit M2 and the third charge storage unit M3 but to the first charge storage unit M1.

Furthermore, pTx4, pTx5, and pTx6 are at the L level. Accordingly, the second transfer units 108, 109, and 110 are in the OFF state, charges to be used for the formation of an image of the (n−1)th frame are stored in the second charge storage unit M2 and the third charge storage unit M3, and charges generated in this period are transferred to the first charge storage unit M1 for storage.

At the time t12, pRes for the nth row is changed from the state at the time t11 to the L level and the operation of resetting the input node 112 ends.

At the time t13, pTx5 and pTx6 for the nth row are changed from the state at the time 12 to the H level. As a result, the second second-transfer unit 109 and the third second-transfer unit 110 are brought into the ON state, and charges stored in each second charge storage unit M2 and each third charge storage unit M3 in the nth row are transferred to the input node 112.

Since pSEL for the nth row is at the H level, each selection transistor 114 in the nth row is in the ON state and a signal is output to the signal line 621 via the amplification transistor 111 and the selection transistor 114. At the time t14, pTx5 and pTx6 for the nth row are changed from the state at the time t13 to the L level, the second second-transfer unit 109 and the third second-transfer unit 110 are brought into the OFF state, and each signal output to the signal line 621 is sampled by the column circuit (not illustrated).

At the time t15, pSEL for the nth row is changed from the state at the time t14 to the L level and pSEL for the (n+1)th row is brought into the H level. Accordingly, each selection transistor 114 in the nth row is brought into the OFF state and each selection transistor 114 in the (n+1)th row is brought into the ON state. In addition, pRES for the (n+1)th row is brought into the H level and each reset transistor 113 in the (n+1)th row is brought into the ON state. Through these operations, the potential of each input node 112 in the (n+1)th row is reset.

At the time t16, pRes for the (n+1)th row is changed from the state at the time t15 to the L level and the operation of resetting each input node 112 in the (n+1)th row ends.

At the time t17, pTx5 and pTx6 for the (n+1)th row are changed from the state at the time 16 to the H level, and the second second-transfer unit 109 and the third second-transfer unit 110 are brought into the ON state. As a result, charges stored in each second charge storage unit M2 and each third charge storage unit M3 in the (n+1)th row are transferred to the input node 112. Since pSEL for the (n+1)th row is at the H level, each selection transistor in the (n+1)th row is in the ON state and a signal is output to the signal line 621 via the amplification transistor 111 and the selection transistor 114.

At the time t18, pTx5 and pTx6 for the (n+1)th row are changed from the state at the time 17 to the L level, the second second-transfer unit 109 and the third second-transfer unit 110 are brought into the OFF state, and each signal output to the signal line 621 is sampled by the column circuit (not illustrated).

At the time t19, pSEL for the (n+1)th row is changed from the state at the time 18 to the L level and each selection transistor 114 in the (n+1)th row is brought into the OFF state. Although not illustrated in FIG. 7 for the simplification of the drawing, in a case where a signal is output from each pixel in the (n+2)th row to the signal line 621, pSEL for the (n+2)th row (not illustrated) is brought into the H level and each selection transistor in the (n+2)th row is brought into the ON state. In addition, pRES for the (n+2)th row is brought into the H level and each reset transistor in the (n+2)th row is brought into the ON state. The potential of each input node 112 in the (n+2)th row is reset.

At the time t20, pTx3 for all rows is changed from the state at the time t19 (the state in which the output of a pixel from each pixel in all rows to the signal line 621 has ended) to the H level and each third first-transfer unit 104 in all rows is brought into the ON state. Subsequently, in a period from the time t20 to the time t21 in the first exposure period T12, charges generated by the photoelectric conversion unit are stored in the first charge storage unit M1 and the third charge storage unit M3. That is, during the first period T1, the first first-transfer unit 102 is kept in the ON state.

At the time t21, pTx1 and pTx3 for all rows are changed from the state at the time 20 to the L level. As a result, each first first-transfer unit 102 and each third first-transfer unit 104 in all rows are brought into the OFF state and the first charge storage unit M1 and the third charge storage unit M3 are electrically isolated from the photoelectric conversion unit.

Furthermore, pTx2 for all rows is brought into the H level. As a result, each second first-transfer unit 103 in all rows is brought into the ON state and charges generated by the photoelectric conversion unit are transferred to the second charge storage unit M2 for storage. In the second exposure period T34, the second charge storage unit M2 that has not stored charges in the first exposure period T12 stores charges. That is, in the second period T2, the first first-transfer unit 102 and the third first-transfer unit 104 are kept in the ON state.

The charges that have been generated by the photoelectric conversion unit and been stored in the first charge storage unit M1 and the third charge storage unit M3 in the first exposure period T12 are read out in the third period T3. By bringing pTx3 for all rows into the H level at the time t30, charges generated in the fourth period T4 are stored in the second charge storage unit M2 and the third charge storage unit M3. During third period T3, the second first-transfer unit 103 is kept in the ON state. During the fourth period T4, the second first-transfer unit 103 and the third first-transfer unit 104 are kept in the ON state.

In a period from the time t19 to the time t20, the operation of resetting the second charge storage unit M2 and the third charge storage unit M3 may be performed by changing pTx5, pTx6, and pRES for all rows to the H level and bringing corresponding units into the ON state. In a period from the time t29 to the time t30, the operation of resetting the first charge storage unit M1 and the third charge storage unit M3 may be performed by changing pTx4, pTx6, and pRES for all rows to the H level and bringing corresponding units into the ON state.

Alternatively, in the second period T2, the operation of resetting the second charge storage unit M2 may be performed by changing pTx5 and pRES for all rows to the H level and bringing corresponding units into the ON state. Alternatively, in the fourth period T4, the operation of resetting the first charge storage unit M1 may be performed by changing the pTx4 and pRES to the H level and bringing corresponding units into the ON state.

As described previously, the third charge storage unit M3 stores both charges generated in the second period T2 that is a part of the first exposure period T12 and charges generated in the fourth period T4 that is a part of the second exposure period T34.

As illustrated in FIG. 5, the area of the third charge storage unit M3 in plan view is the largest so as to have the largest capacitance value. With this configuration, the capacitance of the third charge storage unit M3 that is used in both the first exposure period T12 and the second exposure period T34 can be increased and a saturation charge amount in each exposure period can be increased.

As illustrated in FIG. 7, the second period T2 and the fourth period T4 in which only the storage of charges is performed are longer than the first period T1 and the third period T3 in which the transfer of charges is performed. The capacitance values (areas) of the first charge storage unit M1 and the second charge storage unit M2 can therefore be reduced. Since the areas of the first charge storage unit M1 and the second charge storage unit M2 can be reduced, the area of the third charge storage unit M3 can be increased and the proportion of the area of the third charge storage unit M3 in the area of the pixel can be increased.

In this embodiment, an exemplary case in which there are three charge storage units has been described. However, four or more charge storage units may be provided. In this case, the fourth charge storage unit and the following charge storage units are driven at the same time of driving of the third charge storage unit.

Second Embodiment

An image pickup apparatus according to this embodiment will be described with reference to FIG. 8 and FIGS. 9A to 9D. Referring to the drawings, the same reference numerals are used to identify parts already described in the first embodiment, and the detailed description thereof will be therefore omitted. The equivalent circuit of an image pickup apparatus according to this embodiment is different from that of an image pickup apparatus according to the first embodiment.

Figure 8:
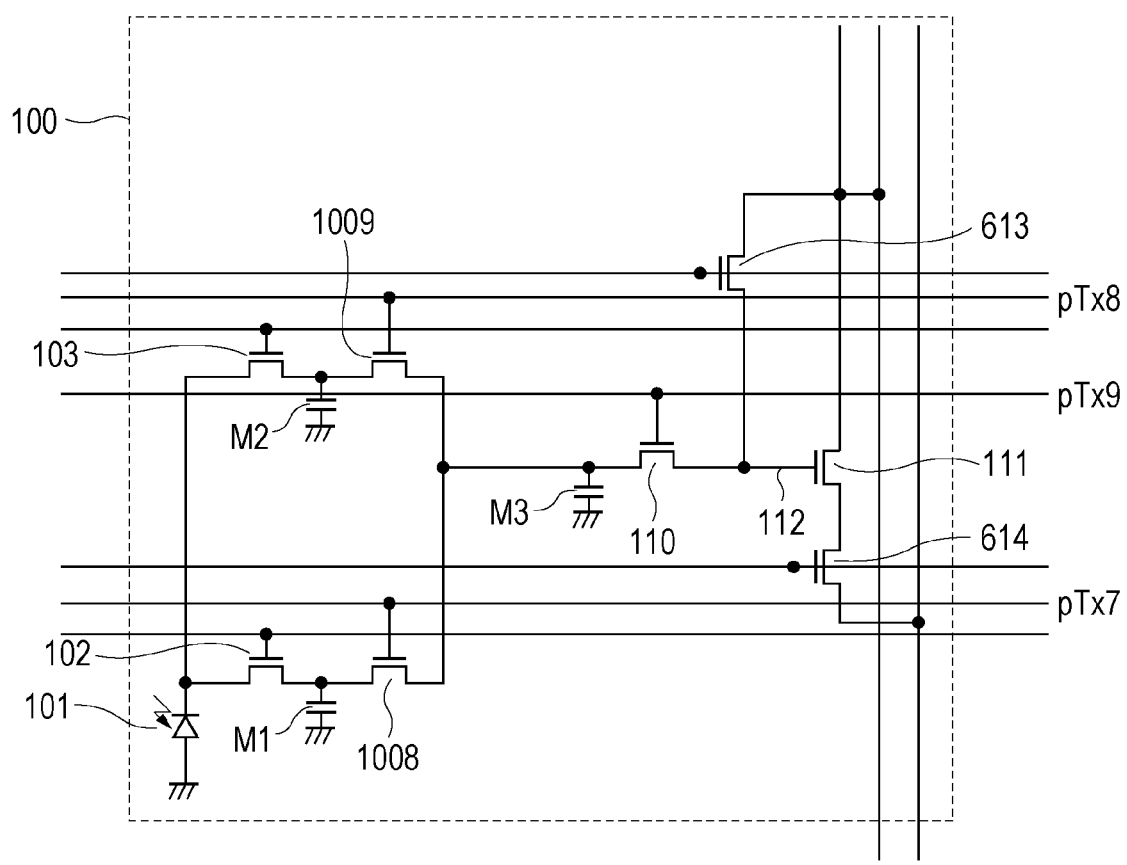
FIG. 8 is an equivalent circuit diagram of a pixel.

FIG. 8 is a diagram illustrating the equivalent circuit of an image pickup apparatus according to this embodiment. FIGS. 9A to 9D are schematic diagrams describing the movement of charges from the photoelectric conversion unit 101 to each charge storage unit.

As illustrated in FIG. 8, in this embodiment, the first charge storage unit M1 and the second charge storage unit M2 are connected in parallel to the photoelectric conversion unit 101. The third charge storage unit M3 is disposed on an electric path between each of the first charge storage unit M1 and the second charge storage unit M2 and the input node 112. There are provided a third transfer unit 1008 for transferring charges from the first charge storage unit M1 to the third charge storage unit M3 and a fourth transfer unit 1009 for transferring charges from the second charge storage unit M2 to the third charge storage unit M3.

Figure 9A:
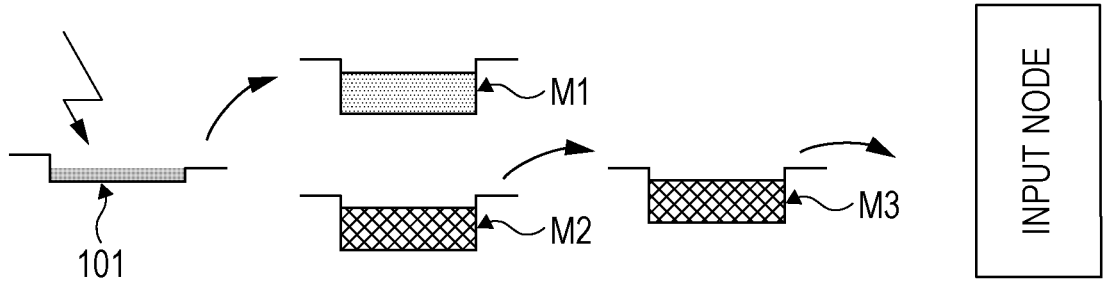
FIGS. 9A to 9D are schematic diagrams describing the movement of charges in each pixel.
Figure 9B:
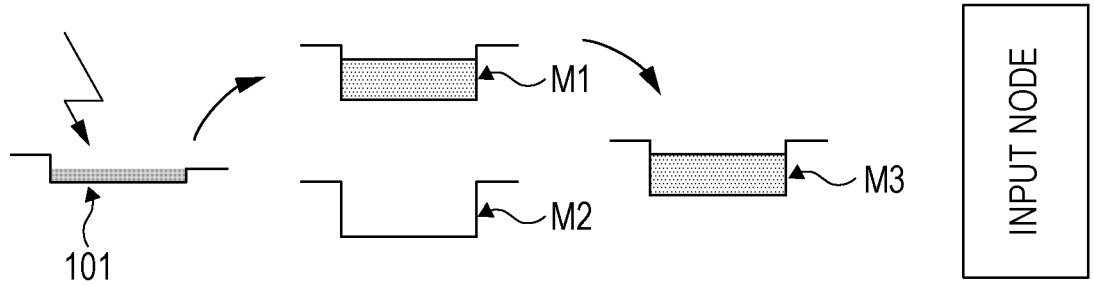
Figure 9C:
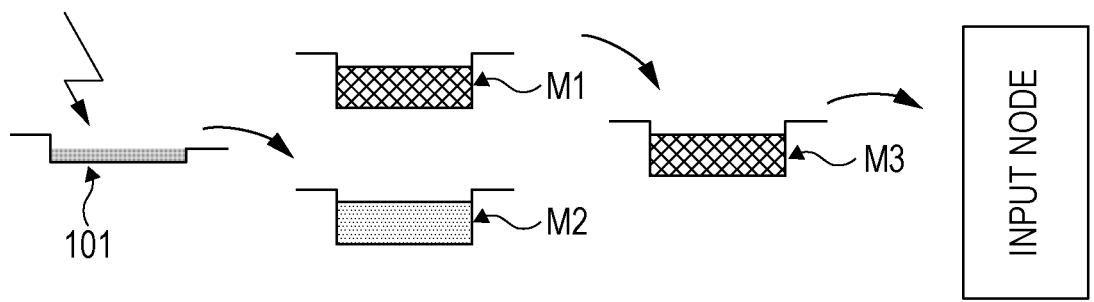
Figure 9D:
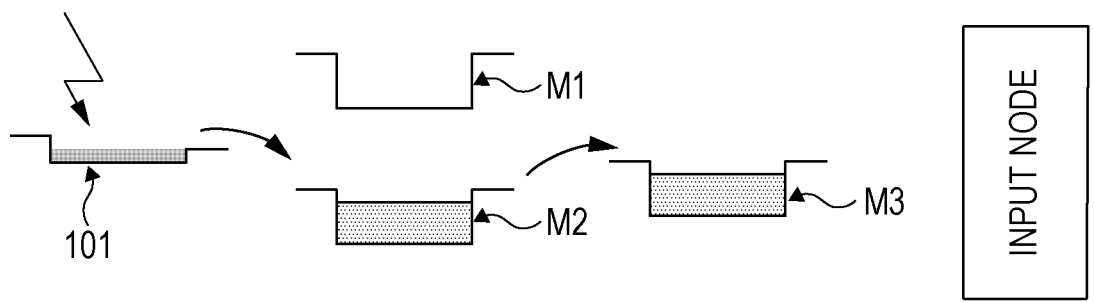

FIG. 9A is a diagram illustrating the movement of charges among the photoelectric conversion unit 101, the charge storage units, and the input node 112 of the amplification transistor 111 in the first period T1 in FIG. 1. FIGS. 9B, 9C, and 9D are diagrams illustrating the movement of charges among the photoelectric conversion unit 101, the charge storage units, and the input node 112 of the amplification transistor 111 in the second period T2, the third period T3, and the fourth period T4 in FIG. 1, respectively.

Referring to FIG. 9A, each first charge storage unit M1 in all rows stores charges generated by the photoelectric conversion unit 101 in the first period T1. The transfer of charges to be used for the formation of an image of the preceding frame (the (n−1)th frame) from the second charge storage unit M2 and the third charge storage unit M3 to the input node 112 is performed in units of rows. At that time, the second transfer units 110 and the fourth transfer units 1009 in each row are sequentially brought into the ON state.

Referring to FIG. 9B, in all rows, charges generated in the second period T2 are transferred to the first charge storage unit M1 and the third charge storage unit M3 for storage. At that time, since the third transfer unit 1008 is in the ON state, the first charge storage unit M1 and the third charge storage unit M3 are electrically connected to each other.

Referring to FIG. 9C, each second charge storage unit M2 in all rows stores charges generated by the photoelectric conversion unit 101 in the third period T3. The transfer of charges that are stored in the first charge storage unit M1 and the third charge storage unit M3 and are to be used for the formation of an image of the nth frame to the input node 112 is performed in units of rows. At that time, the third transfer units 1008 and the second transfer units 110 in each row are sequentially brought into the ON state.

Referring to FIG. 9D, in all rows, charges generated by the photoelectric conversion unit in the fourth period T4 are transferred to the second charge storage unit M2 and the third charge storage unit M3 for storage. At that time, since the fourth transfer unit 1009 is in the ON state, the second charge storage unit M2 and the third charge storage unit M3 are electrically connected to each other.

In a case where image capturing is continuously performed, for example, moving image capturing is performed, using a driving method according to this embodiment, a charge storage unit that is not used for the storage of charges generated at the image capturing of the last frame is used. As a result, charges generated by the photoelectric conversion unit can be used without a break at the time of switching between exposure periods of frames.

Third Embodiment

In this embodiment, the relationship among the capacitance values of the first charge storage unit M1, the second charge storage unit M2, and the third charge storage unit M3 in image pickup apparatuses according to the first and second embodiments will be described. A relationship according to this embodiment satisfies the following inequalities 1 and 2.

In inequality 1, the sum of capacitance values of the first charge storage unit M1 and the third charge storage unit M3 is equal to or larger than the half of a capacitance value of the whole charge storage unit. In inequality 2, the sum of capacitance values of the second charge storage unit M2 and the third charge storage unit M3 is equal to or larger than the half of a capacitance value of the whole charge storage unit.

$$C_1 + C_3 \geq \frac{C_1 + C_2 + C_3}{2} \ [fF] \quad \text{Inequality 1}$$

$$C_2 + C_3 > \frac{C_1 + C_2 + C_3}{2} \ [fF] \quad \text{Inequality 2}$$

In these inequalities, C1 represents the capacitance value (fF) of the first charge storage unit, C2 represents the capacitance value (fF) of the second charge storage unit, and C3 represents the capacitance value (fF) of the third charge storage unit.

By applying this configuration to image pickup apparatuses according to the first and second embodiments, the effect of increasing the saturation charge amount of each frame can be obtained in addition to the effects described in the first and second embodiments. In the case of a configuration (comparative example) in which two charge storage units (the first charge storage unit and the second charge storage unit) are provided and are exclusively used, it is difficult to obtain the saturation charge amount of each frame larger than the half of a capacitance value of the whole charge storage unit. Using the relationship among capacitance values according to this embodiment, it is possible to obtain the saturation charge amount of each frame larger than the half of a capacitance value of the whole charge storage unit.

In addition, by making the capacitance value of the third charge storage unit M3 that is commonly used in the first exposure period T12 and the second exposure period T34 larger than the capacitance values of the first charge storage unit M1 and the second charge storage unit M2, the saturation charge amount of each frame can be further increased.

Next, the configuration of a charge storage unit according to this embodiment will be described. Examples of a capacitor used as a charge storage unit include a PN junction capacitor, a MOS capacitor, a parallel plate capacitor formed by sandwiching a dielectric between polysilicon. When such a capacitor is provided for each charge storage unit, a capacitance value per unit area may differ from charge storage unit to charge storage unit or the same capacitance value per unit area may be obtained in all charge storage units.

First, a case where the same capacitance value per unit area is obtained in all charge storage units will be described. For example, in a case where each charge storage unit is a PN junction capacitor, impurities added to the PN junction capacitors are identical in type, density, and depth. At that time, the charge storage units can be formed using the same mask. For example, in a case where each charge storage unit is a parallel plate capacitor, the same distance between parallel plates is obtained in all charge storage units. For example, in a case where each charge storage unit is a MOS capacitor, semiconductor regions under gate electrodes forming the MOS transistors have the same impurity concentration and the same depth.

In these cases, the magnitude relationship among the areas of the charge storage units in plan view correspond to the magnitude relationship among the capacitance values of the charge storage units.

In a case where a parameter used to determine the capacitance value of each charge storage unit is not the area of the charge storage unit and differs from charge storage unit to charge storage unit, a capacitance value per unit area differs from charge storage unit to charge storage unit.

In this embodiment, an exemplary case in which there are three charge storage units has been described. However, four or more charge storage units may be provided. In this case, the fourth charge storage unit and the following charge storage units are treated as a part of the third charge storage unit M3.

Fourth Embodiment

An image pickup apparatus according to this embodiment specifies the capacitance value of each charge storage unit and a period during which each charge storage unit stores charges. In the drawings, the same reference numeral is used to represent the same component or the same part, and the detailed description thereof will be therefore omitted.

In the first exposure period T12 illustrated in FIG. 1, the capacitance value of the first charge storage unit M1 is defined as C1 and the capacitance value of the third charge storage unit M3 is defined as C3. In the first period T1, the second charge storage unit M2 and the third charge storage unit M3 store charges generated in the preceding frame and the first charge storage unit M1 stores charges generated in the first frame. This period is defined as tc1. A period in which the first charge storage unit M1 and the third charge storage unit M3 store charges generated in the first frame in the second period T2 is defined as tc3. At that time, in an image pickup apparatus according to this embodiment, the relationship between C1 and C3 satisfies equation 3 using the lengths of the periods tc1 and tc3.

$$C1 = C3 \frac{tc1}{tc3} \ [fF] \quad \text{Equation 3}$$

According to this embodiment, in the periods tc1 and tc3, the storage of charges in the third charge storage unit M3 can be started before the first charge storage unit M1 is saturated.

Figure 10:
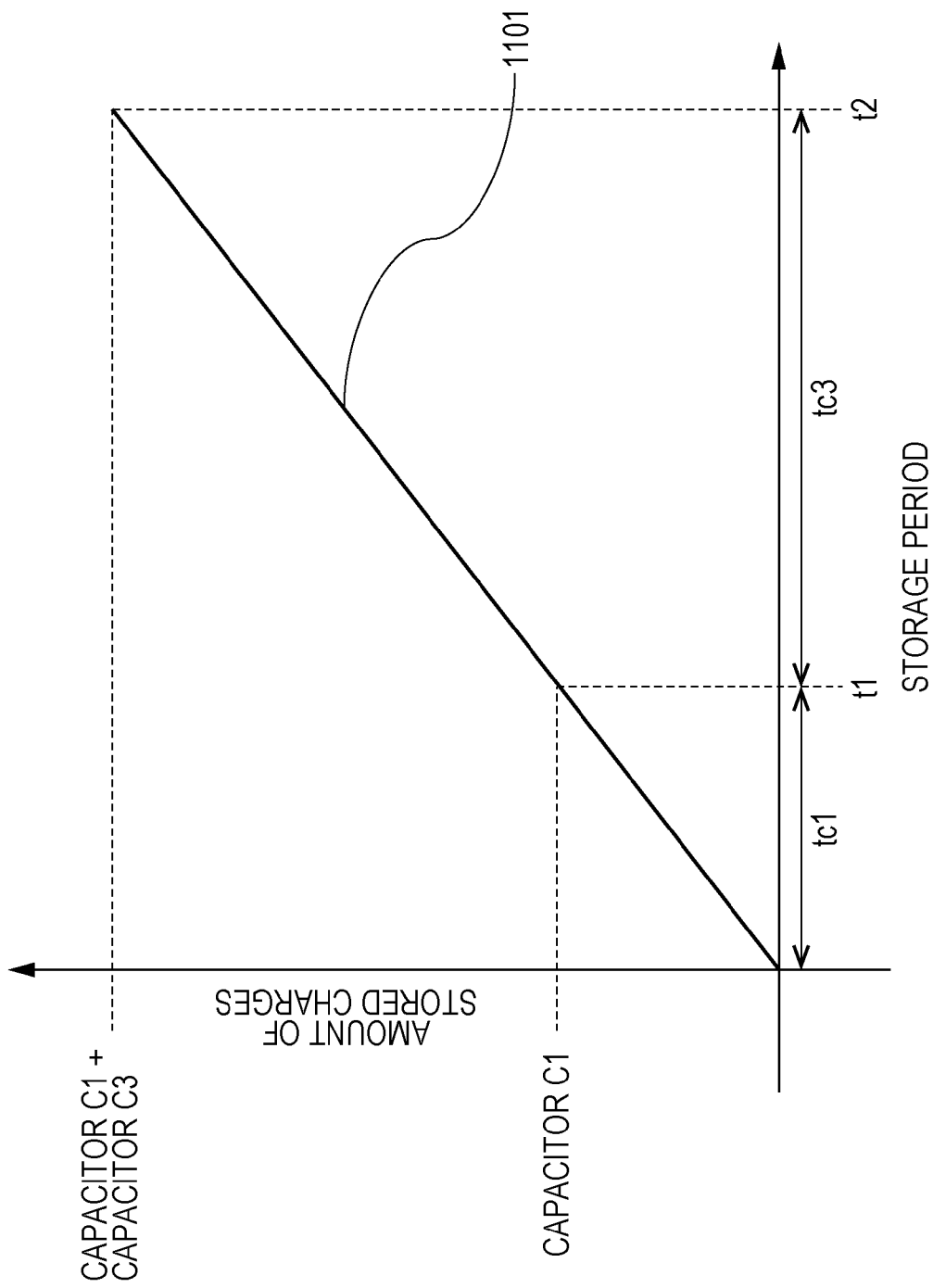
FIG. 10 is a diagram describing the relationship between a storage period and the amount of stored charges.

FIG. 10 is a diagram describing the relationship between a storage period and the amount of stored charges.

A horizontal axis represents a storage period, and a vertical axis represents the amount of stored charges. At the vertical axis, the capacitance C1 of the first charge storage unit M1 and the sum of C1 and the capacitance value C3 of the third charge storage unit M3 are illustrated. At the horizontal axis, the storage periods tc1 and tc3 are illustrated. The time t1 is a time at which the period tc1 ends and the time t2 is a time at which the storage period tc3 ends.

A graph 1101 represents the relationships between a storage period and the amount of stored charges under a predetermined amount of light in the storage periods tc1 and tc3. Referring to the graph 1101, at the time t2, the first charge storage unit M1 and the third charge storage unit M3 are saturated. The amount of stored charges at the time t1 is the saturated amount of charges stored in the first charge storage unit M1.

The capacitance C1 may be larger than the capacitance represented by equation 3. The reason for this is that, even if C1 is larger than the capacitance, the first charge storage unit M1 does not reach a saturation level at the time t1. Accordingly, the capacitance C1 may be set so that it satisfies inequality 4.

$$C1 \geq C3 \frac{tc1}{tc3} \ [fF] \quad \text{Inequality 4}$$

In a case where charges are stored in the second charge storage unit M2 and the third charge storage unit M3, inequality 5 is derived like in the case of the first charge storage unit M1 and is satisfied. In inequality 5, C2 represents the capacitance of the second charge storage unit M2 and tc2 represents a storage period (for example, the fourth period T4 in the first embodiment).

$$C2 \geq C3 \frac{tc2}{tc3} \ [fF] \quad \text{Inequality 5}$$

Thus, by setting the capacitance values of the first charge storage unit M1 and the third charge storage unit M3 so that inequality 4 is satisfied, the first charge storage unit M1 does not reach a saturation level even under a large amount of light and the storage of charges in the third charge storage unit M3 can be started. By performing setting so that inequalities 4 and 5 are satisfied and performing driving operations described in the above-described embodiments, moving image capturing can be performed without a break.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-216615, filed Oct. 23, 2014, which is hereby incorporated by reference herein in its entirety.

What is claimed is:

1. An image pickup apparatus comprising a plurality of pixels each including:
    a photoelectric conversion unit;
    a charge storage unit configured to store charges generated by the photoelectric conversion unit; and
    an amplification unit configured to output a signal based on charges stored by the charge storage unit, the charge storage unit including a first charge storage unit, a second charge storage unit, and a third charge storage unit,
    wherein, in a first period from a first time to a second time, charges generated by the photoelectric conversion unit in each of the plurality of pixels in the first period are transferred to the first charge storage unit and charges stored in the second charge storage unit and the third charge storage unit in a period preceding the first period are transferred to an input node of the amplification unit, and
    wherein, in a second period from the second time to a third time, charges generated by the photoelectric conversion unit in each of the plurality of pixels in the second period are transferred to the first charge storage unit and the third charge storage unit for storage.

2. The image pickup apparatus according to claim 1,
    wherein, in a third period from the third time to a fourth time, charges generated by the photoelectric conversion unit in each of the plurality of pixels in the third period are transferred to the second charge storage unit for storage and charges stored in the first charge storage unit and the third charge storage unit are transferred to the input node of the amplification unit, and
    wherein, in a fourth period from the fourth time to a fifth time, charges generated by the photoelectric conversion unit in each of the plurality of pixels in the fourth period are transferred to the second charge storage unit and the third charge storage unit for storage.

3. The image pickup apparatus according to claim 2, wherein each of the plurality of pixels further includes:
    a first first-transfer unit configured to transfer charges generated by the photoelectric conversion unit to the first charge storage unit,
    a second first-transfer unit configured to transfer charges generated by the photoelectric conversion unit to the second charge storage unit, and
    a third first-transfer unit configured to transfer charges generated by the photoelectric conversion unit to the third charge storage unit.

4. The image pickup apparatus according to claim 3, wherein, during the first period, the first first-transfer unit is kept in an ON state.

5. The image pickup apparatus according to claim 3, wherein, during the second period, the first first-transfer unit and the third first-transfer unit are kept in an ON state.

6. The image pickup apparatus according to claim 3, wherein, during the third period, the second first-transfer unit is kept in an ON state.

7. The image pickup apparatus according to claim 3, wherein, during the fourth period, the second first-transfer unit and the third first-transfer unit are kept in an ON state.

8. The image pickup apparatus according to claim 1, wherein the second period is longer than the first period.

9. The image pickup apparatus according to claim 1, wherein, after charges have been transferred from the charge storage unit to the input node of the amplification unit, the charge storage unit is reset.

10. The image pickup apparatus according to claim 1, wherein the first charge storage unit and the second charge storage unit are connected in parallel to the photoelectric conversion unit.

11. The image pickup apparatus according to claim 10, wherein the third charge storage unit is connected in parallel to the photoelectric conversion unit along with the first charge storage unit and the second charge storage unit.

12. The image pickup apparatus according to claim 10, wherein the third charge storage unit is disposed on an electric path between the input node and each or both of the first charge storage unit and the second charge storage unit.

13. The image pickup apparatus according to claim 1, wherein, when capacitance values of the first charge storage unit, the second charge storage unit, and the third charge storage unit are defined as C1, C2, and C3, respectively, inequalities 1 and 2 are satisfied as follows:

$$C_1 + C_3 \geq \frac{C_1 + C_2 + C_3}{2} \ [fF], \quad \text{Inequality 1}$$

and $$C_2 + C_3 \geq \frac{C_1 + C_2 + C_3}{2} \ [fF]. \quad \text{Inequality 2}$$

14. The image pickup apparatus according to claim 2, wherein, when capacitance values of the first charge storage unit, the second charge storage unit, and the third charge storage unit are defined as C1, C2, and C3, respectively, and lengths of the first period, the second period, and the third period are defined as tc1, tc2, and tc3, respectively, inequalities 3 and 4 are satisfied as follows:

$$C1 \geq C3 \times \frac{tc1}{tc3}, \quad \text{Inequality 3}$$

and $$C2 \geq C3 \times \frac{tc2}{tc3}. \quad \text{Inequality 4}$$

* * * * *